United States Patent
Oka et al.

(10) Patent No.: US 12,142,462 B2
(45) Date of Patent: Nov. 12, 2024

(54) METHOD OF REDUCING LEAKAGE OF HEAT TRANSFER GAS AND PLASMA PROCESSING APPARATUS

(71) Applicant: Tokyo Electron Limited, Tokyo (JP)

(72) Inventors: Shinsuke Oka, Miyagi (JP); Akira Takahashi, Miyagi (JP); Daisuke Tamura, Miyagi (JP); Tsubasa Shimomura, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/641,911

(22) Filed: Apr. 22, 2024

(65) Prior Publication Data
US 2024/0274412 A1   Aug. 15, 2024

Related U.S. Application Data

(63) Continuation of application No. PCT/JP2023/003808, filed on Feb. 6, 2023.

(60) Provisional application No. 63/268,985, filed on Mar. 8, 2022.

(51) Int. Cl.
*H01J 37/32* (2006.01)

(52) U.S. Cl.
CPC .... *H01J 37/32642* (2013.01); *H01J 37/3244* (2013.01); *H01J 37/32724* (2013.01); *H01J 37/32183* (2013.01); *H01J 2237/2007* (2013.01)

(58) Field of Classification Search
None
See application file for complete search history.

(56) References Cited

U.S. PATENT DOCUMENTS

| | | | | |
|---|---|---|---|---|
| 2012/0281334 | A1* | 11/2012 | Sasaki | H01J 37/32642 361/234 |
| 2018/0182635 | A1* | 6/2018 | Tsukahara | C23C 16/4585 |
| 2021/0308812 | A1* | 10/2021 | Maeda | H01J 37/32715 |
| 2021/0335645 | A1* | 10/2021 | Ueda | H01L 21/6833 |
| 2022/0108879 | A1* | 4/2022 | Ueda | H01J 37/32724 |

FOREIGN PATENT DOCUMENTS

| | | |
|---|---|---|
| JP | 2012-195463 | 10/2012 |
| JP | 2019-004086 | 1/2019 |
| JP | 2022-007865 | 1/2022 |
| KR | 10-2018-0131414 | 12/2018 |

* cited by examiner

*Primary Examiner* — Shamim Ahmed
(74) *Attorney, Agent, or Firm* — IPUSA, PLLC

(57) ABSTRACT

With respect to a method of reducing leakage of a heat transfer gas, the method includes mounting an edge ring on a main body including an electrostatic chuck; attracting the edge ring to the electrostatic chuck; increasing a temperature of the edge ring; decreasing the temperature of the edge ring; and repeating the increasing of the temperature and the decreasing of the temperature a plurality of times.

9 Claims, 4 Drawing Sheets

METHOD OF REDUCING LEAKAGE OF HEAT TRANSFER GAS AND PLASMA PROCESSING APPARATUS

CROSS-REFERENCE TO RELATED APPLICATIONS

This application is a continuation application of International Application No. PCT/JP2023/003808 filed on Feb. 6, 2023, and designating the U.S., which is based upon and claims priority to U.S. Provisional Application No. 63/268,985, filed on Mar. 8, 2022, the entire contents of which are incorporated herein by reference.

BACKGROUND

1. Technical Field

The present disclosure relates to a method of reducing leakage of a heat transfer gas and a plasma processing apparatus.

2. Description of the Related Art

Patent Document 1 discloses that an etching apparatus in which an edge ring is electrostatically attracted to an electrostatic chuck and a helium gas is supplied to a lower surface of the edge ring.

RELATED ART DOCUMENT

Patent Document

[Patent Document 1] Japanese Laid-Open Patent Application Publication No. 2022-007865

SUMMARY

According to one embodiment of the present disclosure, with respect to a method of reducing leakage of a heat transfer gas, the method includes mounting an edge ring on a main body including an electrostatic chuck; attracting the edge ring to the electrostatic chuck; increasing a temperature of the edge ring; decreasing the temperature of the edge ring; and repeating the increasing of the temperature and the decreasing of the temperature a plurality of times.

DETAILED DESCRIPTION

Figure 1:
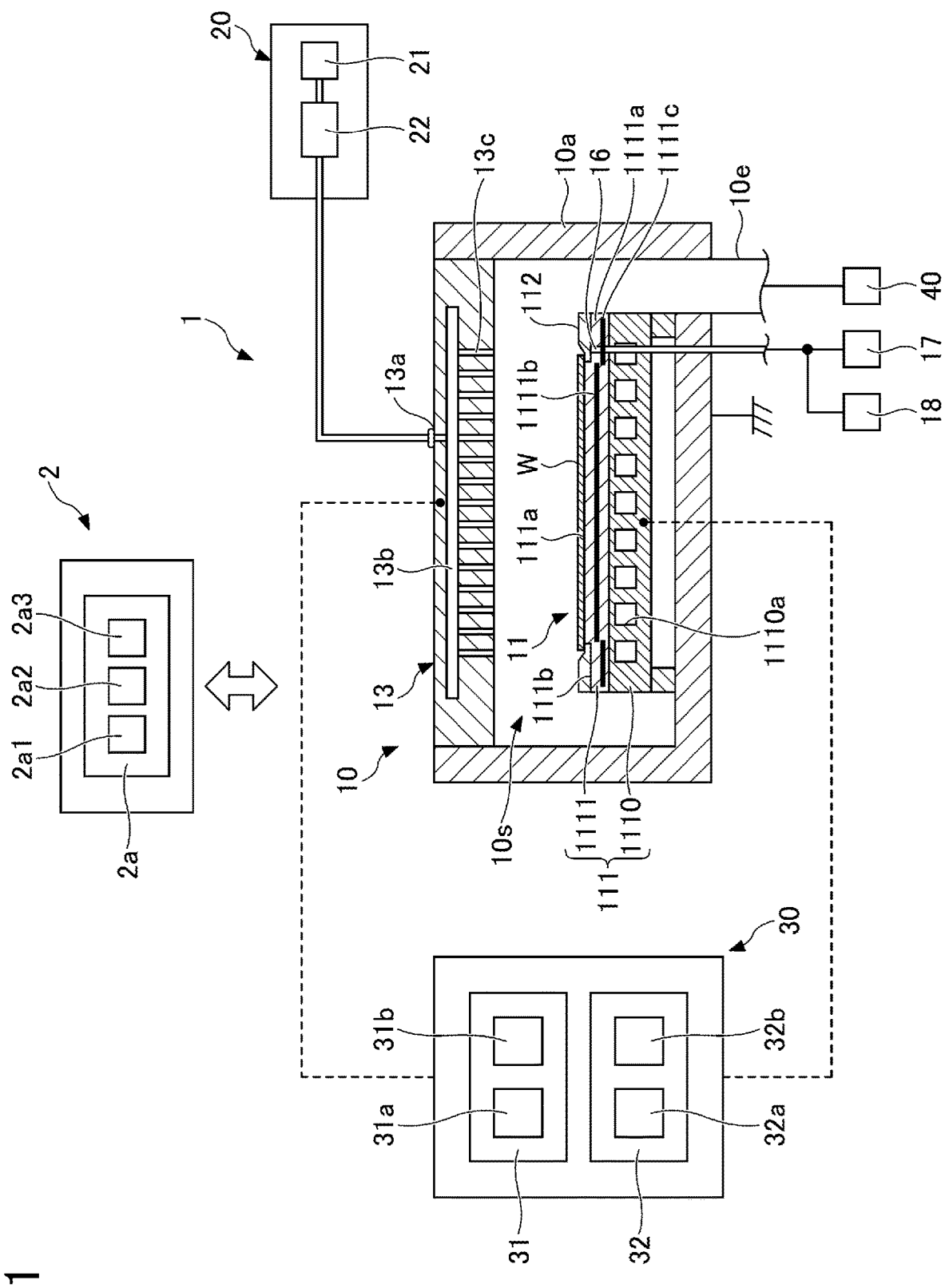
FIG. 1 is an example of a drawing for explaining a configuration example of a capacitively coupled plasma processing apparatus.

Various exemplary embodiments will be described in detail below with reference to the drawings. Here, in the drawings, the same or corresponding parts are denoted by the same reference symbols.

[Plasma Processing System]

In the following, a configuration example of a plasma processing system will be described. FIG. 1 is an example of a drawing for explaining a configuration example of a capacitively coupled plasma processing apparatus (substrate processing apparatus) 1.

The plasma processing system includes the capacitively coupled plasma processing apparatus 1 and a controller 2. The capacitively coupled plasma processing apparatus 1 includes a plasma processing chamber 10, a gas supply 20, a power supply 30, and an exhaust system 40. Additionally, the plasma processing apparatus 1 includes a substrate support 11 and a gas introduction section. The gas introduction section is configured to introduce at least one process gas into the plasma processing chamber 10. The gas introduction section includes a shower head 13. The substrate support 11 is disposed inside the plasma processing chamber 10. The shower head 13 is disposed above the substrate support 11. In one embodiment, the shower head 13 forms at least a portion of a ceiling of the plasma processing chamber 10. The plasma processing chamber 10 has a plasma processing space 10$s$ defined by the shower head 13, a sidewall 10$a$ of the plasma processing chamber 10, and the substrate support 11. The plasma processing chamber 10 has at least one gas inlet for supplying at least one process gas to the plasma processing space 10$s$ and at least one gas outlet for exhausting the gas from the plasma processing space 10$s$. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111$a$ for supporting a substrate W and an annular region 111$b$ for supporting the ring assembly 112. A wafer is an example of the substrate W. The annular region 111$b$ of the main body 111 surrounds the central region 111$a$ of the main body 111 in plan view. The substrate W is disposed on the central region 111$a$ of the main body 111, and the ring assembly 112 is disposed on the annular region 111$b$ of the main body 111 so as to surround the substrate W on the central region 111$a$ of the main body 111. Thus, the central region 111$a$ is also referred to as a substrate support surface for supporting the substrate W, and the annular region 111$b$ is also referred to as a ring support surface for supporting the ring assembly 112.

In one embodiment, the main body 111 includes a base 1110 and an electrostatic chuck 1111. The base 1110 includes a conductive member. The conductive member of the base 1110 can function as a lower electrode. The electrostatic chuck 1111 is disposed on the base 1110. The electrostatic chuck 1111 include a ceramic member 1111$a$ and electrostatic electrodes 1111$b$ and 1111$c$ disposed in the ceramic member 1111$a$. The ceramic member 1111$a$ has the central region 111$a$. In one embodiment, the ceramic member 1111$a$ also has the annular region 111$b$. An electrostatic electrode 1111$b$ is provided in the central region 111$a$. The electrostatic electrode 1111$c$ is provided in the annular region 111$b$. Here, other members surrounding the electrostatic chuck 1111, such as an annular electrostatic chuck or an annular insulating member, may have the annular region 111$b$. In this case, the ring assembly 112 may be disposed on the annular electrostatic chuck or the annular insulating member, or may be disposed on both the electrostatic chuck 1111 and the annular insulating member. Additionally, at least one RF/DC electrode coupled to a radio frequency (RF) power supply 31, a direct current (DC) power supply 32, or both, which will be described later, may be disposed in the ceramic member 1111a. In this case, the at least one RF/DC electrode functions as a lower electrode. If a bias RF signal, a DC signal, or both, which will be described later, is provided to the at least one RF/DC electrode, the RF/DC electrode is also referred to as a bias electrode. Here, the conductive member of the base 1110 and the at least one RF/DC electrode may function as multiple lower electrodes. Additionally, the electrostatic electrode 1111b may function as a lower electrode. Therefore, the substrate support 11 includes at least one lower electrode.

The ring assembly 112 includes one or more annular members. In one embodiment, the one or more annular members include one or more edge rings 112A (see FIG. 2 to be described later) and at least one cover ring. The edge ring 112A is made of a conductive material or an insulating material, and the cover ring is made of an insulating material.

Additionally, the substrate support 11 may include a temperature control module configured to adjust at least one of the electrostatic chuck 1111, the ring assembly 112, or the substrate W to a target temperature. The temperature control module may include heaters 1111f and 1111g (see FIG. 2 to be described later), a heat transfer medium, a flow path 1110a, or a combination thereof. A heat transfer fluid such as brine or gas flows through the flow path 1110a. In one embodiment, the flow path 1110a is formed in the base 1110 and one or more heaters are disposed in the ceramic member 1111a of the electrostatic chuck 1111. Additionally, the substrate support 11 may include a heat transfer gas supply configured to supply a heat transfer gas to a gap between a back surface of the substrate W and the central region 111a.

Additionally, the substrate support 11 is provided with a flow path 16 communicating with a gap between a back surface of the edge ring 112A and the annular region 111b. A heat transfer gas supply 17 and an exhaust section 18 are connected to the flow path 16. The heat transfer gas supply 17 supplies the heat transfer gas to the gap between the back surface of the edge ring 112A and the annular region 111b through the flow path 16. The exhaust section 18 exhausts the heat transfer gas from the gap between the back surface of the edge ring 112A and the annular region 111b through the flow path 16.

The shower head 13 is configured to introduce at least one process gas from the gas supply 20 into the plasma processing space 10s. The shower head 13 includes at least one gas supply port 13a, at least one gas diffusion chamber 13b, and multiple gas introduction ports 13c. The process gas supplied to the gas supply port 13a passes through the gas diffusion chamber 13b and is introduced into the plasma processing space 10s through the gas introduction ports 13c. Additionally, the shower head 13 includes at least one upper electrode. Here, the gas introduction section may include one or more side gas injectors (SGI) attached to one or more openings formed in the sidewall 10a, in addition to the shower head 13.

The gas supply 20 may include at least one gas source 21 and at least one flow rate controller 22. In one embodiment, the gas supply 20 is configured to supply at least one process gas from the corresponding gas source 21 to the shower head 13 via the corresponding flow rate controller 22. Each of the flow rate controllers 22 may include, for example, a mass flow controller or a pressure control type flow rate controller. Further, the gas supply 20 may include one or more flow modulation devices to modulate or pulse the flow of the at least one process gas.

The power supply 30 includes an RF power supply 31 coupled to the plasma processing chamber 10 through at least one impedance matching circuit. The RF power supply 31 is configured to supply at least one RF signal (RF power) to the at least one lower electrode, the at least one upper electrode, or both. This allows plasma to be formed from the at least one process gas supplied to the plasma processing space 10s. Thus, the RF power supply 31 may function as at least a part of a plasma generating section configured to generate plasma from one or more process gases in the plasma processing chamber 10. Additionally, by supplying the bias RF signal to the at least one lower electrode, a bias potential is generated in the substrate W, and ion components in the formed plasma can be attracted to the substrate W.

In one embodiment, the RF power supply 31 includes a first RF generator 31a and a second RF generator 31b. The first RF generator 31a is coupled to the at least one lower electrode, the at least one upper electrode, or both via the at least one impedance matching circuit and is configured to generate a source RF signal (source RF power) for plasma generation. In one embodiment, the source RF signal has a frequency in a range of 10 MHz to 150 MHz. In one embodiment, the first RF generator 31a may be configured to generate multiple source RF signals having different frequencies. The generated one or more source RF signals are supplied to the at least one lower electrode, the at least one upper electrode, or both.

The second RF generator 31b is coupled to the at least one lower electrode via the at least one impedance matching circuit and is configured to generate a bias RF signal (bias RF power). The frequency of the bias RF signal may be equal to or different from the frequency of the source RF signal. In one embodiment, the bias RF signal has a frequency that is lower than the frequency of the source RF signal. In one embodiment, the bias RF signal has a frequency in a range of 100 kHz to 60 MHz. In one embodiment, the second RF generator 31b may be configured to generate multiple bias RF signals having different frequencies. The generated one or more bias RF signals are supplied to the at least one lower electrode. Additionally, in various embodiments, at least one of the source RF signal or the bias RF signal may be pulsed.

Additionally, the power supply 30 may include a DC power supply 32 coupled to the plasma processing chamber 10. The DC power supply 32 includes a first DC generator 32a and a second DC generator 32b. In one embodiment, the first DC generator 32a is connected to the at least one lower electrode and is configured to generate a first DC signal. The generated first bias DC signal is applied to the at least one lower electrode. In one embodiment, the second DC generator 32b is connected to the at least one upper electrode and is configured to generate a second DC signal. The generated second DC signal is applied to the at least one upper electrode.

In various embodiments, at least one of the first and second DC signals may be pulsed. In this case, a sequence of voltage pulses is applied to the at least one lower electrode, the at least one upper electrode, or both. The voltage pulse may have a pulse waveform of a rectangular shape, a trapezoidal shape, a triangular shape, or a combination thereof. In one embodiment, a waveform generator for generating a sequence of voltage pulses from the DC signal is connected between the first DC generator 32a and the at least one lower electrode. Therefore, the first DC generator 32a and the waveform generator constitute a voltage pulse generator. When the second DC generator 32b and the waveform generator constitute the voltage pulse generator, the voltage pulse generator is connected to the at least one the upper electrode. The voltage pulse may have a positive polarity or a negative polarity. Additionally, the sequence of voltage pulses may include one or more positive polarity voltage pulses and one or more negative polarity voltage pulses in one period. Here, the first and second DC generators 32a and 32b may be provided in addition to the RF power supply 31, or the first DC generator 32a may be provided instead of the second RF generator 31b.

The exhaust system 40 may be connected to a gas exhaust port 10e provided at a bottom of the plasma processing chamber 10, for example. The exhaust system 40 may include a pressure regulating valve and a vacuum pump. A pressure inside the plasma processing space 10s is adjusted by the pressure regulating valve. The vacuum pump may include a turbo molecular pump, a dry pump, or a combination thereof.

The controller 2 processes computer executable instructions that cause the plasma processing apparatus 1 to perform various processes described in the present disclosure. The controller 2 may be configured to control each element of the plasma processing apparatus 1 to perform various processes described herein. In one embodiment, a part or all of the controller 2 may be included in the plasma processing apparatus 1. The controller 2 may include a processor 2a1, a storage unit 2a2, and a communication interface 2a3. The controller 2 is implemented by, for example, a computer 2a. The processor 2a1 may be configured to read a program from the storage unit 2a2 and execute the read program to perform various control operations. The program may be stored in the storage unit 2a2 in advance, or may be acquired via a medium when necessary. The acquired program is stored in the storage unit 2a2, and is read from the storage unit 2a2 and executed by the processor 2a1. The medium may be various storage media readable by the computer 2a or a communication line connected to the communication interface 2a3. The processor 2a1 may be a central processing unit. The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line, such as a local area network (LAN).

Figure 2:
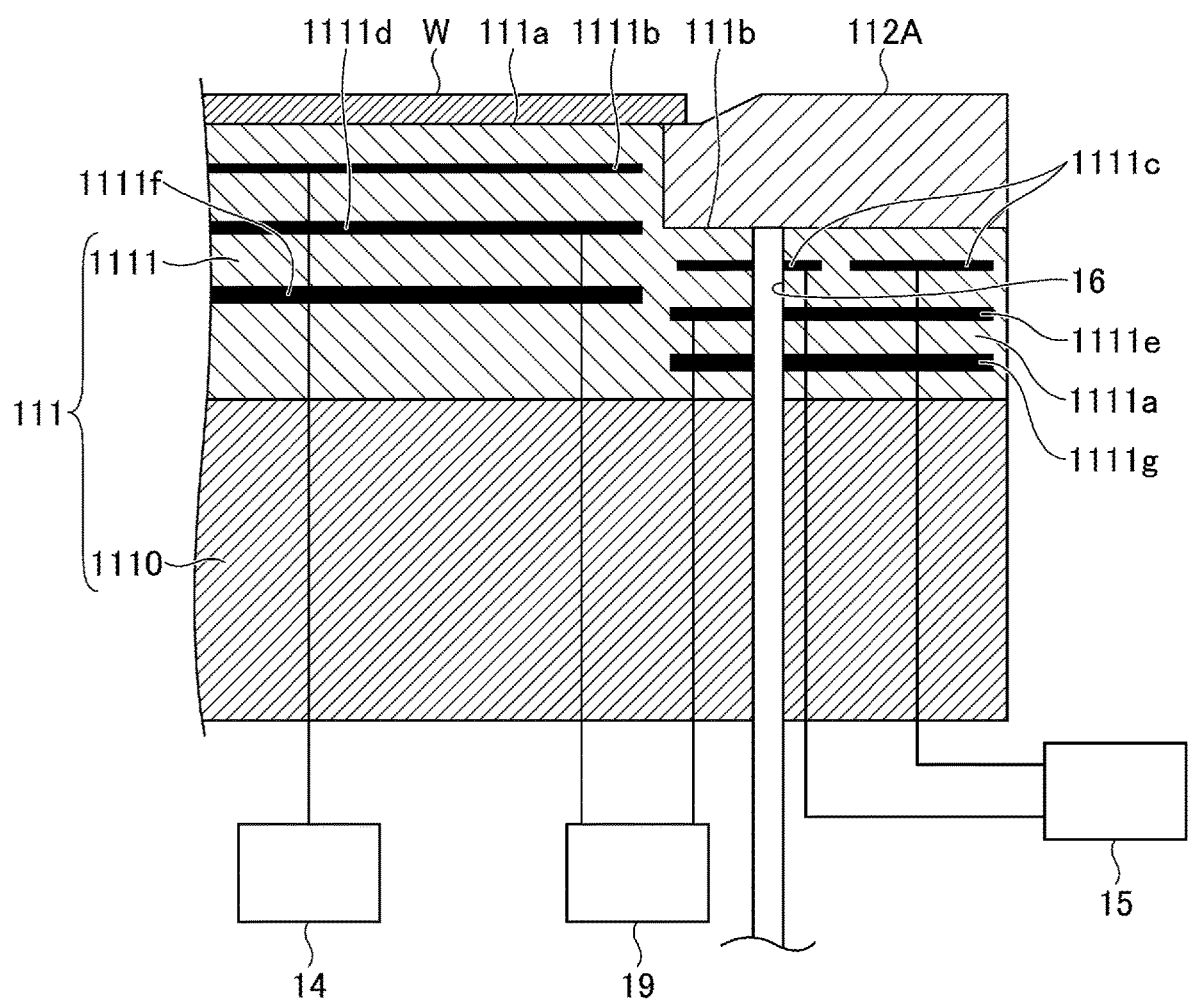
FIG. 2 is an example of a schematic partial enlarged sectional view illustrating a configuration of a substrate support near an edge ring.

[Substrate Support]Next, the substrate support 11 will be further described with reference to FIG. 2. FIG. 2 is an example of a partially enlarged cross-sectional view for explaining a configuration of the substrate support 11 near the edge ring 112A.

The electrostatic electrode 1111b for attracting the substrate W is provided in the ceramic member 1111a under the central region 111a. The electrostatic electrode 1111b is connected to a chuck power supply 14.

The electrostatic electrode 1111c for attracting the edge ring 112A is provided in the ceramic member 1111a under the annular region 111b. The electrostatic electrode 1111c is, for example, a bipolar electrode. The electrostatic electrode 1111c is connected to a chuck power supply 15.

Bias electrodes 1111d and 1111e may be provided in the ceramic member 1111a. The bias electrode 1111d is provided in the ceramic member 1111a under the central region 111a. The bias electrode 1111e is provided in the ceramic member 1111a under the annular region 111b. The bias electrodes 1111d and 1111e are connected to a bias power supply 19. The bias power supply 19 applies a negative pulse voltage as a bias DC signal to the bias electrodes 111d and 1111e. Additionally, the bias electrodes 111d and 1111e may be connected to an RF power supply (not illustrated) for supplying an RF signal. Additionally, the power supply 30 (see FIG. 1) may be used as the bias power supply 19 and the RF power supply (not illustrated).

Here, the electrostatic electrode 1111b and the bias electrode 1111d may be provided separately as illustrated in FIG. 2, or the electrostatic electrode 1111b may function as the bias electrode 1111d. Additionally, the electrostatic electrode 1111c and the bias electrode 1111e may be provided separately as illustrated in FIG. 2, or the electrostatic electrode 1111c may function as the bias electrode 1111e.

The heaters 1111f and 1111g may be provided in the ceramic member 1111a. The heater 1111f is provided in the ceramic member 1111a under the central region 111a. The heater 1111g is provided in the ceramic member 1111a under the annular region 111b. The heaters 1111f and 1111g are connected to a heater power supply (not illustrated).

Here, a case where the plasma processing apparatus 1 is a plasma etching processing apparatus will be described as an example. In the plasma processing apparatus 1, the electrostatic chuck 1111 is used to hold the substrate W. Additionally, the conductive edge ring 112A is disposed around the substrate W to improve the evenness of the etching shape. The edge ring 112A may be held by the electrostatic chuck 1111 for holding the substrate W or an electrostatic chuck different from the electrostatic chuck 1111. In this case, a heat transfer gas may be filled between the edge ring 112A and the electrostatic chuck 1111 in order to increase a heat transfer rate. As the heat transfer gas, for example, helium gas is used.

However, because processed shapes of surfaces of the edge ring 112A and the electrostatic chuck 1111 that are in contact with each other do not completely match with each other, a gap is formed between the edge ring 112A and the electrostatic chuck 1111, and the heat transfer gas may leak. When the leakage increases, the etching shape changes, and therefore, it is desired to reduce the leakage.

Figure 3:
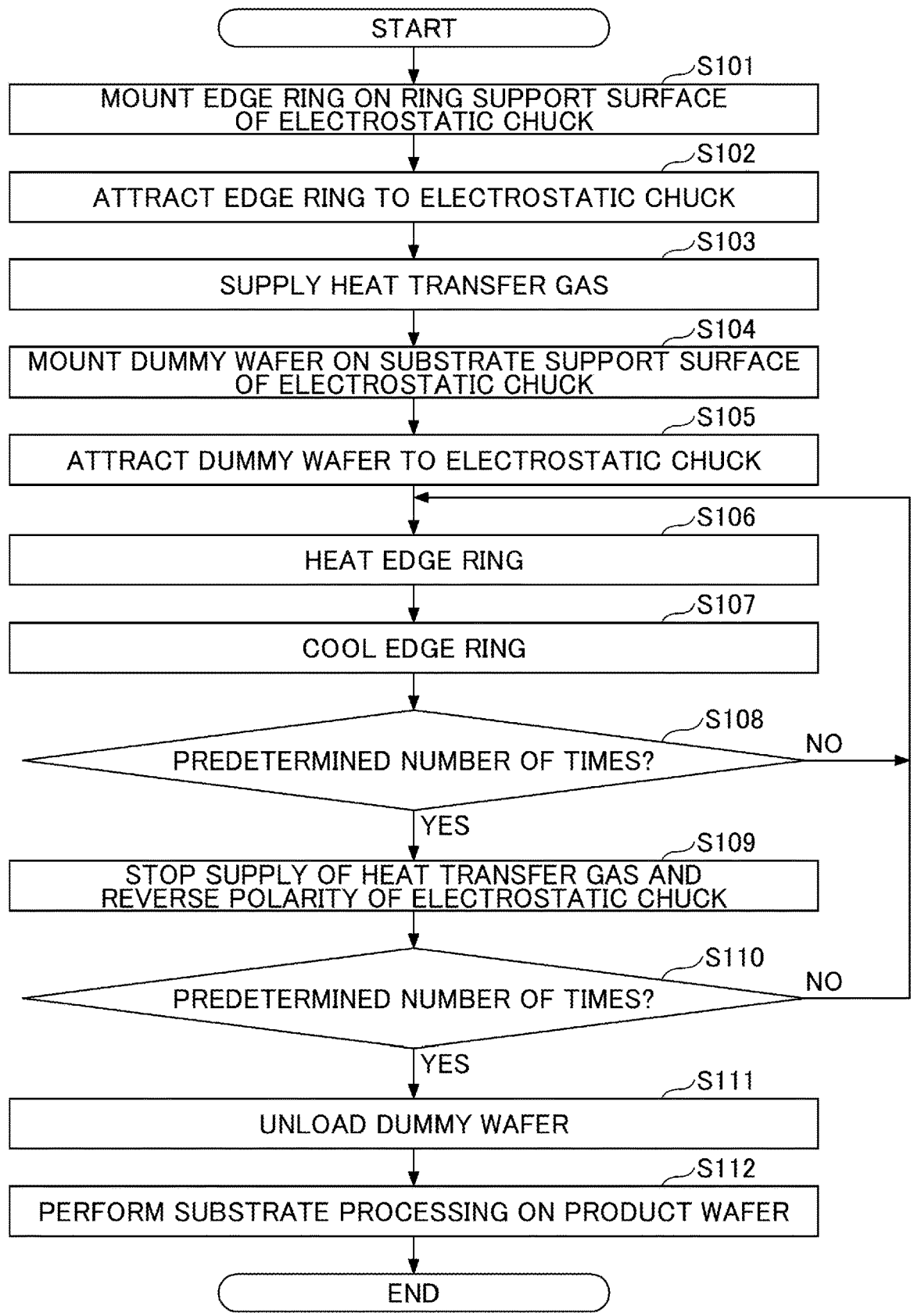
FIG. 3 is an example of a flowchart for explaining a method of reducing leakage of a heat transfer gas.

Next, a method of reducing the leakage of the heat transfer gas will be described with reference to FIG. 3. FIG. 3 is an example of a flowchart for explaining the method of reducing the leakage of the heat transfer gas.

In step S101, the edge ring 112A is mounted on the ring support surface (the annular region 111b) of the electrostatic chuck 1111. Here, the edge ring 112A may be mounted manually by an operator after opening the plasma processing chamber 10, or automatically by a transfer arm (not illustrated) provided in a vacuum transfer chamber (not illustrated) provided adjacent to the plasma processing chamber 10. Here, an example of a material of the edge ring 112A is silicon. An example of a material of the ceramic member 1111a of the electrostatic chuck 1111 is alumina.

In step S102, after the inside of the plasma processing chamber 10 is depressurized to a predetermined pressure, the edge ring 112A is attracted to the electrostatic chuck 1111. First, the controller 2 controls the exhaust system 40 to depressurize the inside of the plasma processing chamber 10 to the predetermined pressure. Then, the controller 2 controls the chuck power supply 15 to apply a voltage to the bipolar electrostatic electrode 111c. This causes the edge ring 112A to be electrostatically attracted to the electrostatic chuck 1111.

In the step S103, the heat transfer gas is supplied between the edge ring 112A and the electrostatic chuck 1111. The controller 2 controls the heat transfer gas supply 17 to supply the heat transfer gas between the edge ring 112A and the electrostatic chuck 1111. Here, an example of the heat transfer gas is helium gas.

In step S104, a dummy wafer (a wafer having no pattern formed on a surface thereof) is mounted on the substrate support surface (the central region 111a) of the electrostatic chuck 1111. Here, the dummy wafer may be automatically mounted by the transfer arm (not illustrated) provided in the vacuum transfer chamber (not illustrated) provided adjacent to the plasma processing chamber 10.

In step S105, the dummy wafer is attracted to the electrostatic chuck 1111. The controller 2 controls the chuck power supply 14 to apply a voltage to the electrostatic electrode 1111b. This causes the dummy wafer to be electrostatically attracted to the electrostatic chuck 1111.

Here, the order of the processes from step S101 to step S105 is not limited to this. For example, the mounting of the dummy wafer (S104) and the attracting of the dummy wafer (S105) may be performed before the attracting of the edge ring 112A (S102). Additionally, the dummy wafer need not be mounted on the substrate support surface of the electrostatic chuck 1111.

In step S106, the edge ring 112A is heated. Here, the controller 2 may heat the edge ring 112A by controlling the heater power supply (not illustrated) to heat the heaters 1111g and 1111f provided in the electrostatic chuck 1111. Additionally, the controller 2 may heat the edge ring 112A via the electrostatic chuck 1111 by controlling the temperature control module (not illustrated) to flow a high-temperature heat transfer medium (temperature control medium) through the flow path 1110a to control the temperature of the base 1110. The controller 2 may heat the edge ring 112A with heat input from plasma by controlling the plasma generator to generate the plasma in the plasma processing chamber 10.

Additionally, the heating of the edge ring 112A may be performed by combining these methods. By using the heating by the plasma in addition to the temperature adjustment of the base 1110 by the heaters 1111f and 1111g of the electrostatic chuck 1111, the heat transfer medium, or both, the temperature increasing rate of the edge ring 112A can be increased. Here, when the plasma is generated, a bias DC-signal may be applied to the bias electrodes 1111d and 1111e or need not be applied thereto. Additionally, when the dummy wafer is not mounted on the substrate support surface (the central region 111a), it is preferable that the bias DC signal is not supplied to the bias electrode 1111d in order to suppress damage to the substrate support surface of the electrostatic chuck 1111 on which the substrate W is mounted.

In step S107, the edge ring 112A is cooled. Here, the controller 2 may cool the edge ring 112A via the electrostatic chuck 1111 by controlling the temperature control module (not illustrated) to flow a low-temperature heat transfer medium (a temperature control medium) through the flow path 1110a to adjust the temperature of the base 1110. Additionally, when the plasma is generated during the heating of the edge ring 112A (S106), the controller 2 may cool the edge ring 112A by controlling the plasma generator to stop the generation of the plasma.

Here, it is desirable that a temperature difference between the setting temperature of the edge ring 112A during the heating in the step S106 and the setting temperature of the edge ring 112A during the cooling in the step S107 is at least 30° C. or greater.

In step S108, the controller 2 determines whether the number of repetitions of the heating and the cooling of the edge ring 112A has reached a predetermined number of times. When the processes have not been repeated the predetermined number of times (NO in step S108), the process of the controller 2 returns to step S106. When the processes have been repeated the predetermined number of times (YES in step S108), the process of the controller 2 proceeds to step S109.

In step S109, the supply of the heat transfer gas between the edge ring 112A and the electrostatic chuck 1111 is stopped, and the polarity of the electrostatic chuck 1111 is reversed. First, the controller 2 controls the heat transfer gas supply 17 to stop the supplying of the heat transfer gas between the edge ring 112A and the electrostatic chuck 1111. Next, the controller 2 controls the exhaust section 18 to exhaust or decompress the heat transfer gas between the edge ring 112A and the electrostatic chuck 1111. Next, the controller 2 controls the chuck power supply 15 to apply the voltage to the bipolar electrostatic electrode 1111c with the polarity of the applied voltage being reversed. The controller 2 then controls the heat transfer gas supply 17 to supply the heat transfer gas between the edge ring 112A and the electrostatic chuck 1111. This suppresses a decrease in the electrostatic attraction force. Here, this step may be omitted.

In step S110, the controller 2 determines whether the number of repetitions of the processing from step S106 to step S108 has reached a predetermined number of times. If the processing has not been repeated the predetermined number of times (NO in step S110), the process of the controller 2 returns to step S106. If the processing has been repeated the predetermined number of times (YES in step S110), the process of the controller 2 proceeds to step S111.

When the process returns to step S106 and the edge ring 112A is heated (S106), the setting temperature at the time of heating may be equal to or different from the setting temperature at the time of the previous heating. Additionally, when the process returns to step S106 and the edge ring 112A is cooled (S107), the setting temperature at the time of the cooling may be equal to or different from the setting temperature at the time of the previous cooling.

Additionally, as illustrated in the step S108 and the step S110, a temperature cycle of the heating (S106) of the edge ring 112A and the cooling (S107) of the edge ring 112A is repeated multiple times. Specifically, the temperature cycle is preferably performed at least 10 times.

In step S111, the dummy wafer mounted on the substrate support surface (the central region 111a) of the electrostatic chuck 1111 is unloaded. Here, the edge ring 112A is electrostatically attracted to the electrostatic chuck 1111, and the heat transfer gas is filled between the edge ring 112A and the electrostatic chuck 1111.

In step S112, a product wafer (a wafer having a pattern formed on a surface thereof) is loaded into the plasma processing chamber 10, and substrate processing is performed on the product wafer. Here, during the substrate processing of the product wafer, the edge ring 112A is electrostatically attracted to the electrostatic chuck 1111. Additionally, the heat transfer gas is filled between the edge ring 112A and the electrostatic chuck 1111.

Figure 4:
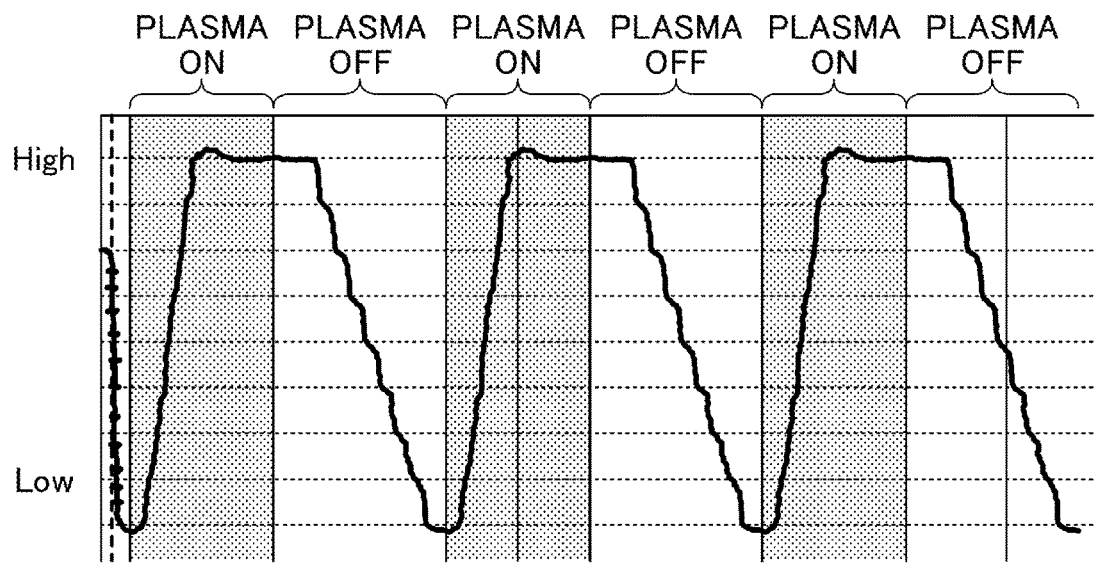
FIG. 4 illustrates an example of a temperature cycle of the present disclosure.

FIG. 4 is an example of the temperature cycle of the present disclosure. The vertical axis represents the temperature of the edge ring 112A, and the horizontal axis represents the time. As illustrated in FIG. 4, the plasma may be generated when the edge ring 112A is heated (S106), and the generation of the plasma may be stopped when the edge ring 112A is cooled (S107). By repeating the generating and the stopping of the generation of the plasma, the heating (the increasing of the temperature) and the cooling (the decreasing of the temperature) of the edge ring 112A can be repeated.

Figure 5:
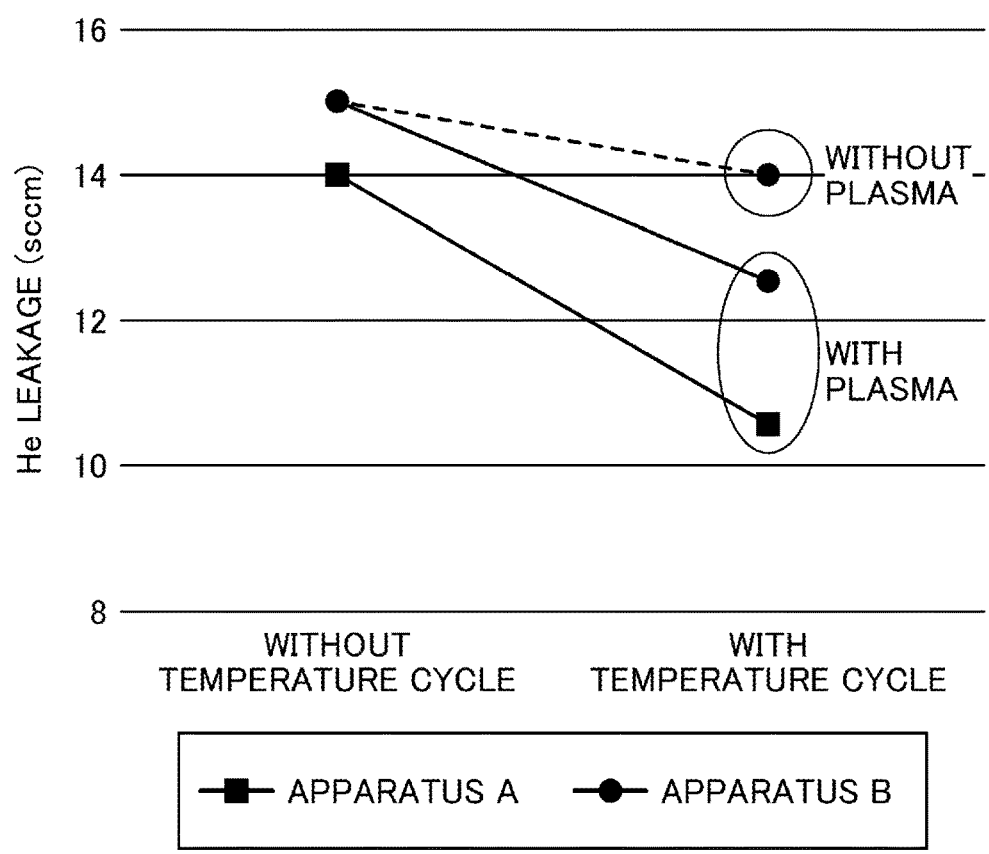
FIG. 5 illustrates an example of a graph comparing leakage of the heat transfer gas.

FIG. 5 is an example of a graph for comparing the leakage of the heat transfer gas. Here, "(a) without temperature cycle" indicates a result of measuring the leakage (sccm) of the heat transfer gas (He gas) after step S103. That is, this corresponds to a case where the processing of step S112 is performed after step S103 by omitting the processing from step S104 to step S111. Additionally, "(b) with temperature cycle" indicates a result of measuring the leakage (sccm) of the heat transfer gas (He gas) after step S111. That is, this corresponds to the case where the process of reducing the leakage of the heat transfer gas is performed according to the flow illustrated in FIG. 3. Here, in the example of FIG. 5, in "(b) with temperature cycle", the temperature cycle of the heating and the cooling is performed 30 times.

Additionally, the leakage of each of an apparatus A and an apparatus B is measured. Additionally, in the apparatus A, the leakage is measured in the case where the plasma is generated during the heating. In the apparatus B, the leakage is measured in each of the case where the plasma is generated during the heating and the case where the plasma is not generated during the heating.

FIG. 5 illustrates that the leakage of the heat transfer gas (He gas) is reduced by performing the temperature cycle in both the apparatus A and the apparatus B. Additionally, the comparison between the case where the plasma is generated during the heating (the solid line) and the case where the plasma is not generated during the heating (the broken line) in the apparatus B illustrates that the leakage of the heat transfer gas (He gas) is further reduced when the plasma is generated.

As described above, after the edge ring 112A is mounted on the electrostatic chuck 1111 and electrostatically attracted to the electrostatic chuck 1111, the temperature of the electrostatic chuck 1111 (the edge ring 112A) is periodically increased and decreased, thereby reducing the leakage of the heat transfer gas filled between the edge ring 112A and the electrostatic chuck 1111.

It is conceivable that the leakage of the heat transfer gas is reduced because the gap between the contact surfaces is reduced due to a shift between the contact surfaces caused by a difference in the thermal expansion coefficient between the edge ring 112A and the electrostatic chuck 1111, the gap between the contact surfaces is reduced due to rubbing between the contact surfaces of the electrostatic chuck 1111 and the edge ring 112A, or both.

Additionally, by generating the plasma during the heating, the temperature increasing rate of the edge ring 112A is increased. From this, it is conceivable that the gap of the contact surfaces of the edge ring 112A and the electrostatic chuck 1111 is further reduced due to the increased shift, rubbing, or both, of the contact surfaces.

Here, in the flowchart illustrated in FIG. 3, the case where the edge ring 112A is cooled after the edge ring 112A is heated has been described as an example, but the embodiment is not limited thereto. For example, the edge ring 112A may be heated after the edge ring 112A is cooled, and the temperature cycle of the cooling and the heating may be repeated.

The embodiments disclosed above include, for example, the following aspects.

(Appendix 1)

A method of reducing leakage of a heat transfer gas, the method including:
mounting an edge ring on a main body including an electrostatic chuck;
attracting the edge ring to the electrostatic chuck;
increasing a temperature of the edge ring;
decreasing the temperature of the edge ring; and
repeating the increasing of the temperature and the decreasing of the temperature a plurality of times.

(Appendix 2)

The method as described in Appendix 1, wherein the repeating is performed in a state where a product wafer is not mounted.

(Appendix 3)

The method as described in Appendix 1 or 2, wherein a thermal expansion coefficient of the electrostatic chuck is different from a thermal expansion coefficient of the edge ring.

(Appendix 4)

The method as claimed in any one of Appendix 1 to Appendix 3, wherein a temperature difference between the increasing of the temperature and the decreasing of the temperature is 30 degrees or greater.

(Appendix 5)

The method as described in any one of Appendix 1 to Appendix 4, wherein the repeating includes repeating the increasing of the temperature and the decreasing of the temperature 10 times or more.

(Appendix 6)

The method as described in any one of Appendix 1 to Appendix 5, further comprising supplying a heat transfer gas between the electrostatic chuck and the edge ring.

(Appendix 7)

The method as described in Appendix 6, wherein the increasing of the temperature and the decreasing of the temperature are performed in a state where the heat transfer gas is filled between the electrostatic chuck and the edge ring.

(Appendix 8)

The method as described in any one of Appendix 1 to Appendix 7, wherein the increasing of the temperature includes generating plasma in a plasma processing chamber that houses the main body.

(Appendix 9)

The method as described in Appendix 8, wherein the decreasing of the temperature includes stopping the generation of the plasma.

(Appendix 10)

The method as described in any one of Appendix 1 to Appendix 9,
wherein the electrostatic chuck includes a bipolar electrostatic electrode, and
wherein the method further comprising reversing a polarity of a voltage applied to the bipolar electrostatic electrode.

(Appendix 11)

A plasma processing apparatus including:
a plasma processing chamber;
a main body disposed in the plasma processing chamber and including an electrostatic chuck;
an edge ring mounted on the electrostatic chuck; and
a controller,
wherein the controller is configured to perform:
attracting the edge ring to the electrostatic chuck;
increasing a temperature of the edge ring;
decreasing the temperature of the edge ring; and
repeating the increasing of the temperature and the decreasing of the temperature multiple times.

According to an aspect of the present disclosure, a method of reducing leakage of a heat transfer gas supplied between an edge ring and an electrostatic chuck and a plasma processing apparatus can be provided.

The present invention is not limited to the configurations described herein, such as the configurations in the above embodiments and combinations with other elements. These points can be changed without departing from the scope and spirit of the present invention, and can be appropriately determined according to the application form thereof.

What is claimed is:

1. A method of reducing leakage of a heat transfer gas, the method comprising:
   mounting an edge ring on a main body including an electrostatic chuck;
   attracting the edge ring to the electrostatic chuck;
   increasing a temperature of the edge ring;
   decreasing the temperature of the edge ring; and
   repeating the increasing of the temperature and the decreasing of the temperature a plurality of times,
   wherein the repeating is performed in a state where a product wafer is not mounted.

2. The method as claimed in claim 1, wherein a thermal expansion coefficient of the electrostatic chuck is different from a thermal expansion coefficient of the edge ring.

3. The method as claimed in claim 1, wherein a temperature difference between the increasing of the temperature and the decreasing of the temperature is 30 degrees or greater.

4. The method as claimed in claim 1, wherein the repeating includes repeating the increasing of the temperature and the decreasing of the temperature 10 times or more.

5. The method as claimed in claim 1, further comprising supplying a heat transfer gas between the electrostatic chuck and the edge ring.

6. The method as claimed in claim 5, wherein the increasing of the temperature and the decreasing of the temperature are performed in a state where the heat transfer gas is filled between the electrostatic chuck and the edge ring.

7. The method as claimed in claim 1, wherein the increasing of the temperature includes generating plasma in a plasma processing chamber that houses the main body.

8. The method as claimed in claim 7, wherein the decreasing of the temperature includes stopping the generation of the plasma.

9. The method as claimed in claim 1,
   wherein the electrostatic chuck includes a bipolar electrostatic electrode, and
   wherein the method further comprising reversing a polarity of a voltage applied to the bipolar electrostatic electrode.

* * * * *